United States Patent [19]

Testin et al.

[11] Patent Number: 4,776,038
[45] Date of Patent: Oct. 4, 1988

[54] AUTOMATIC AIR/CABLE MODE SELECTION APPARATUS FOR A TELEVISION TUNER

[75] Inventors: William J. Testin; John F. Teskey, both of Indianapolis, Ind.

[73] Assignee: RCA Licensing Corporation, Princeton, N.J.

[21] Appl. No.: 5,809

[22] Filed: Jan. 21, 1987

[51] Int. Cl.⁴ .................. H03J 1/16; H04N 5/50
[52] U.S. Cl. ...................... 455/182; 455/186; 455/190; 358/193.1
[58] Field of Search .......... 455/182, 184, 185, 186, 455/188, 190, 193, 275, 164, 168; 358/193.1

[56] References Cited

U.S. PATENT DOCUMENTS

| | | | |
|---|---|---|---|
| 4,009,441 | 2/1977 | Kumagai et al. | 455/190 |
| 4,398,303 | 8/1983 | Chin et al. | 455/168 |
| 4,402,089 | 8/1983 | Knight et al. | 455/186 |
| 4,405,947 | 9/1983 | Tults et al. | 358/193.1 |
| 4,419,768 | 12/1983 | Yamashita et al. | 455/190 |
| 4,430,669 | 2/1984 | Cheung | 358/193.1 |
| 4,518,993 | 5/1985 | Okada et al. | 455/190 |
| 4,555,809 | 11/1985 | Carlson | 455/190 |

FOREIGN PATENT DOCUMENTS

| | | | |
|---|---|---|---|
| 7612119 | 10/1977 | Fed. Rep. of Germany | 358/193.1 |
| 0031612 | 2/1983 | Japan | 358/193.1 |
| 0091776 | 5/1985 | Japan | 358/193.1 |

OTHER PUBLICATIONS

"RCA Color Television Basic Service Data-1986 CTC 133", the description on pp. 1-18 and the schematic on pp. 2-8.

Primary Examiner—Robert L. Griffin
Assistant Examiner—Curtis A. Kuntz
Attorney, Agent, or Firm—Eugene M. Whitacre; Paul J. Rasmussen; Peter M. Emanuel

[57] ABSTRACT

A television receiver cable of tuning either "air" channels in an "air" tuning mode or "cable" channels in a "cable" tuning mode includes apparatus for automatically selecting the tuning mode. The auto-tuning mode apparatus operates in conjunction with apparatus for automatically programming a memory for storing tuning information for tunable channels. When the auto-programming mode is selected, the receiver is caused to operate in the cable tuning mode and a search is conducted for active cable channels. If a predetermined number of active cable channels is located, the receiver remains in the cable tuning mode and the memory is programmed with tuning information for all of the cable channels. If the predetermined number of cable channels is not located, the receiver is caused to operate in the air tuning mode and the memory is programmed with tuning information for all of the air channels.

5 Claims, 2 Drawing Sheets

AUTOMATIC AIR/CABLE MODE SELECTION APPARATUS FOR A TELEVISION TUNER

FIELD OF THE INVENTION

The present invention concerns television receivers capable of tuning either broadcast or cable channels.

BACKGROUND OF THE INVENTION

Many modern television receivers are capable of tuning either broadcast or "off-the-air" channels or cable channels. The "air" and cable bands have different channels. In addition, while the RF signals for the air channels have standard frequencies assigned by the Federal Communications Commission (FCC), the RF signals for the cable channels have non-standard frequencies which may differ from cable network to cable network. Accordingly, receivers capable of tuning either air or cable channels have a so called "air/cable" switch which is manually settable to cause the tuner to tune either air or cable channels.

SUMMARY OF THE INVENTION

It has been recognized by the present inventors that an air/cable switch may be undesirable for several reasons.

The air/cable switch is expensive.

Moreover, setting the air/cable switch to the wrong position for a given type of RF signal source can result in the inability to properly tune received RF signals. This can confuse the user and cause an unnecessary service call.

Therefore, the present inventors have recognized that it is desirable to provide apparatus for automatically selecting the tuning mode of the tuner in accordance with the type of RF signal source provided.

Specifically, in accordance with one aspect of the invention, an automatic tuning mode selection operation is provided during which the tuner is initially set to one of either the air or cable tuning modes and a search is conducted for active channels for which valid RF signals are present. If a predetermined number of active channels are located, the tuner continues to be set to the initial tuning mode. However, if the predetermined number of active channels are not located in the initial tuning mode, the tuner is set to the other tuning mode.

In accordance with a further aspect of the invention, for receivers including a memory for storing tuning information for various channels, the automatic tuning mode selection operation is utilized in conjunction with an automatic programming mode of operation. If the predetermined number of tunable channels is located in the initial tuning mode, the search continues to locate other active channels of the same type and tuning information for the active channels located during the search is stored in the memory. However, if the predetermined number of channels is not located in the initial tuning mode, a search is conducted to locate active channels of the other type and tuning information for the active channels located during the search is stored in the memory.

BRIEF DESCRIPTION OF THE DRAWING

The above and other aspects of the invention will be described with reference to the accompanying Drawing in which.

DETAILED DESCRIPTION OF THE DRAWING

Figure 1:
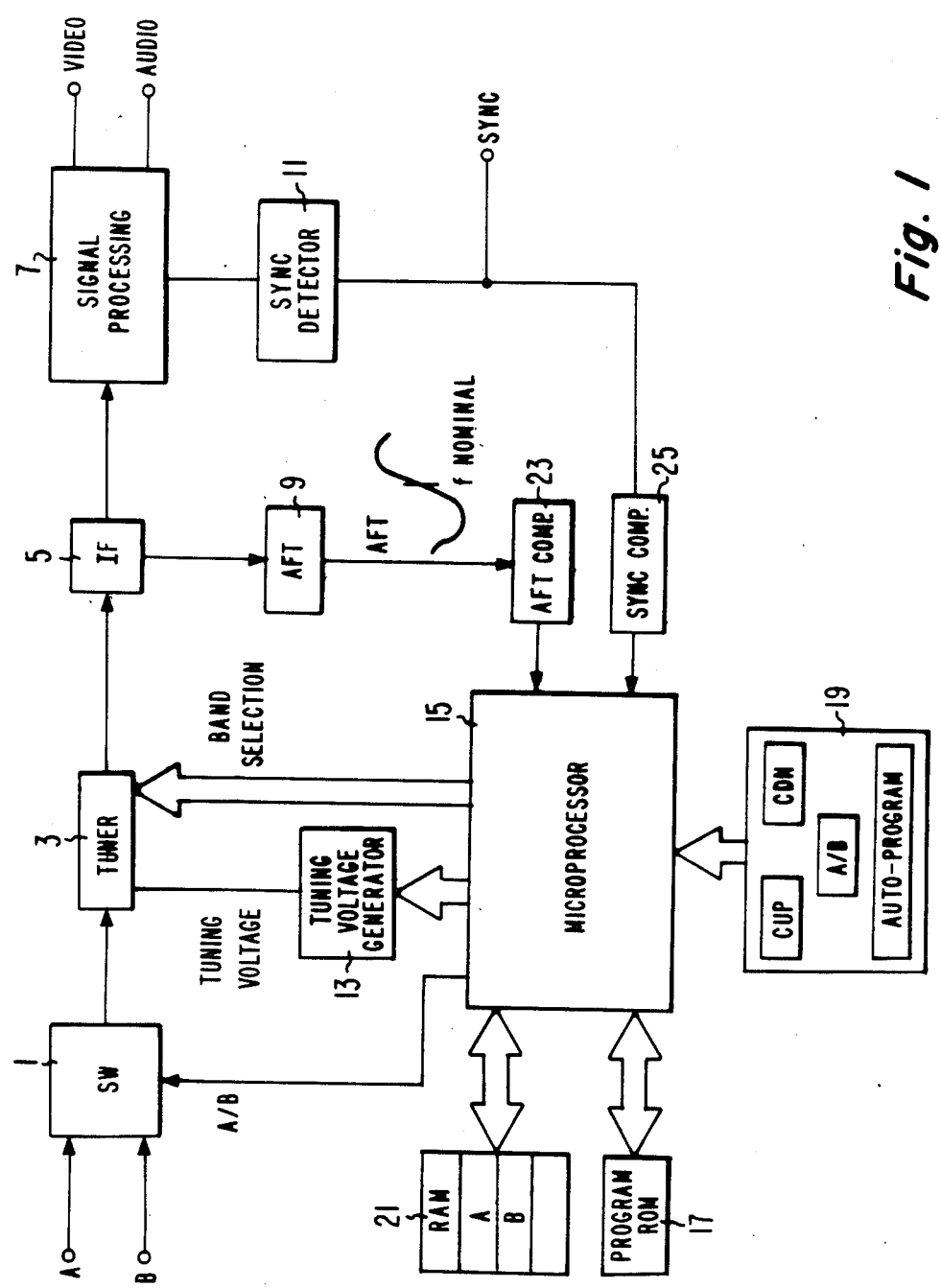
FIG. 1 is a block diagram of a television receiver including a microprocessor controlled tuning system embodying the invention.

The television receiver shown in FIG. 1 includes "A" and "B" RF inputs. Each input may be connected either to a broadcast receiving antenna for receiving "off-the-air" RF signals associated with respective broadcast or "air" channels or a cable distribution network for receiving RF signals associated with respective "cable" channels. A so-called A/B switch 1 is provided for selectively coupling either the RF signals available at RF input "A" or the RF signals available at RF input "B" to a tuner 3 in response to an A/B control signal.

Tuner 3 is capable of tuning either air channels or cable channels. Such tuners are well known in the art and are sometimes referred to as being "cable-ready" or "cable-compatible". Tuner 3 includes an RF stage and local oscillator responsive to a tuning voltage and band selection signals for converting (heterodyning) the RF signal associated with a selected channel to a corresponding IF signal.

The IF signal is processed in conventional fashion in an IF section 5 and coupled to a signal processing section 7. Signal processing section 7 demodulates the modulated picture and sound carriers of the IF signal to produce baseband video and audio signals at respective outputs.

An automatic fine tuning (AFT) signal representing the deviation, if any, of the frequency of the picture carrier of the IF signal from a nominal frequency value, e.g., 45.75 MHz in the United States, is generated by an AFT detector 9. The AFT signal is utilized in the tuning process as will be described below. A composite synchronization ("sync") signal is derived from the video signal by a sync detector 11. In addition to its traditional use, the composite synchronization signal is also utilized in the tuning process.

The tuning voltage for tuner 3 is generated by a tuning voltage generator 13 in response to a digital signal related to the selected channels. Tuning voltage generator 13 may be of the voltage synthesis type including a digital-to-analog converter or of the frequency synthesis type including a frequency or phase locked loop. In the preferred embodiment, tuning voltage generator 13 is of the frequency synthesis type because of the inherent accuracy and stability of the type of system. A suitable frequency synthesis type of tuning voltage generator including a phase locked loop (PLL) is described in U.S. Pat. No. 4,405,947 issued in the name of J. Tults and M. P. French on Sept. 20, 1983. A suitable frequency synthesis type of tuning voltage generator including a frequency locked loop (FLL) is described in U.S. Pat. No. 4,485,404 issued in the name of J. Tults on Nov. 27, 1984. By way of example, it is assumed that a PLL tuning voltage generator is employed.

Briefly, a PLL tuning voltage generator includes a cascade of a fixed frequency divider (usually referred to as a "prescaler") for dividing the frequency of the local oscillator signal by a factor K and a programmable frequency divider for dividing the frequency of the output signal of the prescaler by a programmable factor N. A fixed frequency divider divides the frequency ($f_{XTAL}$) of the output signal of a crystal oscillator by a factor R to derive a reference frequency signal. A phase comparator compares the output signal of the programmable divider to the reference frequency signal to generate an "error" signal representing the phase and frequency deviations between the output signal of the programmable divider and the reference frequency signal. The error signal is filtered to produce the tuning voltage. The tuning voltage controls the frequency ($f_{LO}$) of the local oscillator until:

$$f_{LO} = (NK/R)f_{XTAL}$$

Thus, the frequency of the local oscillator signal can be controlled by controlling programmable factor N.

A microprocessor 15 generates the A/B control signal for A/B switch 1, a digital representation of the programmable factor N for controlling the frequency of the local oscillator signal and the band selection signals for tuner 3. Microprocessor 15 operates under the control of a computer program stored in a read-only-memory (ROM) 17. Microprocessor 15 responds to user command signals generated by a user control keyboard 19. Although keyboard 19 is shown directly connected to microprocessor 15 for simplicity, it may comprise the keyboard of a remote control unit.

Keyboard 19 includes keys for controlling various functions of the television receiver such as turning the receiver "on" and "off", controlling the volume level, selecting either the "A" or "B" RF signal input and selecting channels to be tuned. Only the keys germane to the present invention are shown. An "A/B" key is provided for selecting the RF input. "Channel up" (CUP) and "channel down" (CDN) keys are provided for initiating a "channel scanning" mode of channel selection in which channels are successively tuned in increasing or decreasing frequency order until a channel in a list of preselected channels is located. Those channels not in the preselected list will be automatically skipped during the channel scanning mode. The list of preselected channels is stored in a non-volatile random access memory (RAM) 21 associated with microprocessor 15. Keyboard 19 also includes an "auto-program" key for initating an "auto-programming" mode for automatically "programming" the channel list of RAM 21.

As earlier noted, either of the A and B RF inputs may be connected to an air or cable RF signal source. The RF signals for air channels occupy low VHF, high VHF and UHF tuning bands and have standard frequencies assigned by the FCC. The RF signals for cable channels may also occupy the low VHF, high VHF and UHF bands and in addition may occupy mid, super, hyper and ultra bands interspersed with the low VHF, high VHF and UHF bands. In addition, the RF signals for cable channels do not have standard frequencies and differ from cable network to cable network. Accordingly, the tuning mode of the receiver must be changed depending on whether an air or cable signal source is connected to the selected one of the A and B RF signal inputs. This involves changing the tuning configuration of the RF stage and local oscillator of tuner 3 and also the manner in which the frequency local oscillator is controlled.

The tuning configuration of the RF stage and local oscillator of tuner 3 is selected in response to the band selection signals.

As earlier noted, the frequency of the local oscillator is controlled in accordance with the value of frequency division factor N. Division factor N is set in accordance with the channel number of the channel to be tuned. Since the same channel numbers identify different air and cable channels, microprocessor 15 translates the channel number of the selected channel to the appropriate division factor N depending on whether an air or cable channel is to be tuned.

The values of the division factor N for air channels, which have standard frequency RF signals, are known in advance. Therefore the precise value of N for each air channel can be stored as part of the control program for microprocessor 15.

However, the values of division factor N for cable channels, which do not have standard frequency RF signals, are not known in advance. Therefore the precise value of N for each cable channel cannot be stored in advance. Rather, a search for the correct value of N must be conducted for each cable channel. During this search, the value of N is changed in steps and, at each value of N, it is determined whether or not a valid RF signal is present.

In the present embodiment, the presence of a valid RF signal is determined by examining the conditions of the AFT and composite sync signals. An AFT comparator 23 and a sync comparator 25 coupled to microprocessor 15 are provided for this purpose.

The AFT signal has positive and negative going "humps" or peaks on opposite sides of the nominal frequency of the picture carrier. A detection of these humps by AFT comparator 21 indicates the presence of a carrier of an RF signal. Since the detected carrier may be a sound carrier rather than a picture carrier, sync comparator 13 is provided to determine if the composite sync signal has the characteristics of a valid composite sync signal. A suitable sync validity detector which operates by measuring the frequency and pulse width of the pulses of the composite sync signal is described in the aforementioned Tults patent.

Once the presence of a valid RF signal has been located, tuning can be optimized in response to the AFT signal. In the system described in the Tults patent, the AFT is applied to the tuner in analog form. In the present embodiment, after a valid RF signal has been located during the stepwise search as described above, the value of N is changed in even smaller steps until AFT comparator 23 indicates that the AFT signal is in the region between the positive and negative humps.

During the auto-programming mode, a search is conducted for active channels for which a valid RF signal is present. AFT comparator 23 and sync comparator 23 are also utilized for this purpose. When an active channel is located, an indication is stored in RAM 21.

Since there are two RF inputs for the receiver, RAM 21 has memory portions A and B for storing two different lists of preselected channels. Each of memory portions A and B includes a plurality of memory locations corresponding to respective channels. Each memory location includes a single bit for storing either a logic "1" to indicate that the respective channel is not to be skipped or a logic "0" to indicate that the respective channel is to be skipped.

The memory locations are addressed in response to the channel numbers. Since the same channel numbers correspond to different air and cable channels, microprocessor 15 translates the channel numbers successively generated during the scanning and auto-programming modes to the appropriate memory addresses depending on whether air or cable channels are being tuned.

The user may not want to receive all the active channels located during the auto-programming mode. On the other hand, the user may want tuning to stop at certain channels, such as channels used for a video cassette recorder, video game or home computer, which may not be continuously active and which may thus not be located during the auto-programming mode. For these reasons, keyboard 19 may also include "erase" and "add" keys for manually deleting and adding channels from the list stored in RAM 21. Keyboard 19 may also include digit keys for directly selecting a channel by entering the corresponding channel number. The digit keys may be used in conjunction with the "erase" and "add" keys to delete channels and to add channels to the list stored in RAM 21.

Conventionally, an "air/cable" switch is included in a receiver capable of tuning either air or cable channels for selecting the appropriate tuning mode. If such an air/cable switch is placed in the wrong position for the type of RF signal source connected to the RF input, the tuner will not be capable of properly tuning the received RF signals. The problem is intensified when the receiver has an auto-programming mode of the type described above since not a single channel may be programmed for tuning if the air/cable switch is in the wrong position. These situations may confuse the user and result in an unnecessary service call.

The present tuning system includes provisions for automatically selecting the tuning mode of the receiver thereby overcoming the problem described above. These provisions also make the elimination of an air/cable switch possible.

Figure 2:
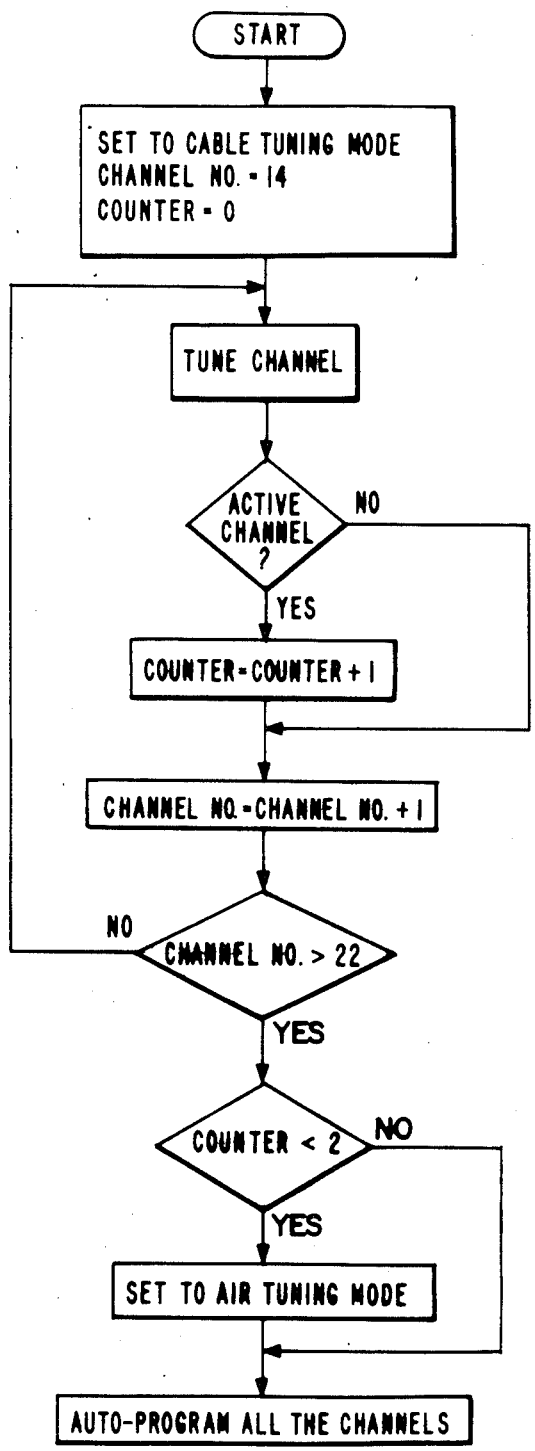
FIG. 2 is a flow chart of a portion of the program for the microprocessor of the embodiment shown in FIG. 1 germane to the present invention.

FIG. 2 shows a flow chart of the auto-tuning mode selection operation. The same operation is performed for each RF input.

When a user presses the auto-programming key of keyboard 19, tuner 3 is initially caused to tune in the cable mode and the channels in a predetermined test group of cable channels (e.g., channels in the midband) are successively caused to be tuned. At each channel, it is determined whether or not a valid RF signal for that channel is present by examining the output signals of AFT comparator 23 and sync comparator 25. If valid RF signals are present for a predetermined number (e.g., 2) of channels in the predetermined group of cable channels, the receiver is kept in the cable tuing mode and the auto-programming operation is initiated to program the channel list of RAM 21 for all of the cable channels. However, if valid RF signals are not present for the predetermined number of channels in the predetermined test group, the receiver is caused to tune in the air tuning mode and the auto-programming mode is initiated to program the channel list of RAM 21 for all of the air channels.

In the present embodiment, the midband group of channels is selected as the test group because it has been found that most cable networks provide at least some midband cable channels. In the same vein, the test group includes only midband cable channels 14 through 22 since this group of channels is the most likely to be used by a cable network.

While it is possible to initially examine air channels rather than cable channels during the auto-mode selection operation, it has been found preferrable to examine the cable channels for the following reasons. Many cable networks provide RF signals which are at the same frequencies as the RF signals for VHF air channels. Therefore, locating a number of RF signals in the VHF frequency range would not be determinative of whether an air or cable signal source is connected to the RF signal source. Accordingly, the UHF frequency range would have to be examined. However, in a given reception area, the required number of RF signals in the UHF frequency range may not be present. Therefore, it has been found that examining cable channels provides the most reliable determination.

In the present embodiment, after the auto-tuning mode selection operation has been performed for each of the A and B RF signal inputs, the A RF signal input is selected and the lowest active channel programmed is caused to be tuned. This occurs independently of how many RF signals are found to be present at each of the RF inputs. The assumption behind this operation is that the A RF input is considered to be the main RF input and the B RF input is considered to be the auxiliary RF input. Alternatively, after the auto-tuning mode selection operation, the RF signal input for which the most RF signals are found could be selected.

While the present invention has been described in terms of a preferred embodiment, modifications within the scope of the invention are contemplated. Some examples are discussed below.

While the auto-mode selecting provision makes the elimination of the air/cable switch possible, apparatus for manually changing the tuning mode may never-the-less be provided.

Information concerning the local oscillator frequencies (i.e., the values of division factor N) at which valid RF signals were located during the auto-tuning mode selection operation may be examined to determine the type of cable system to which the receiver is connected. The result of the examination can be used to facilitate tuning during normal tuning operations.

While, in the disclosed embodiment, tuning information for active channels is stored in RAM 21 during the search of the auto-programming mode initiated after the auto-tuning mode selection operation, it is possible to store tuning information for active channels as they are located during the search of auto-tuning mode selection operation. However, the latter operation has been found to require more program instructions than the one described.

The described auto-programming operation is for storing a list of preselected channels which are not to be skipped during the scanning type of channel selection operation. However, other tuning information, such as the division factors at which valid RF signals are located, may be stored during the auto-programming operation.

These and other modifications are intended to be within the scope of the invention defined by the following claims.

We claim:

1. Tuning apparatus for a television receiver comprising:
   tuner means having an "air" tuning mode for tuning broadcast channels and a "cable" tuning mode for tuning cable channels, each of said tuning modes having a maximum number of channels;
   detector means responsive to an output signal produced by said tuner means for detecting the presence of an RF signal; and
   control means coupled to said tuner means and to said detector means for controlling said tuner means;

said control means controlling an "auto-tuning mode selection" operation in which said tuner means is initially caused to operate in a first one of said tuning modes and to tune successive channels associated with said one tuning mode; said control means being responsive to said detector means during said auto-tuning mode selection operation for determining when a predetermined number of RF signals have been detected to be present and automatically causing tuner means to operate in the other one of said tuning modes if said predetermined number of RF signals is not detected to be present after a predetermined group of channels associated with said first one tuning mode containing less than said maximum number of channels associated with said first one tuning mode have been examined.

2. The tuning apparatus recited in claim 1, wherein:

said control means includes a plurality of memory means for storing tuning information for respective channels;

said control means being responsive to said detector means for entering tuning information into said memory means for ones of said channels successively tuned by said tuner means during an "auto-programming" mode;

said control means further includes auto-programming initiation means for initiating said auto-programming mode and said auto-tuning mode selection operation;

said control means causes tuning information for ones of said channels associated with said first one tuning mode to be entered in said memory means if said predetermined number of RF signals is obtained after said predetermined group of channels associated with said first one tuning mode have been tuned, and causing tuning information for ones of said channels associated with said other tuning mode to be entered in said memory means if said predetermined number of RF signals is not obtained after said predetermined group of channels associated with said first one tuning mode have been tuned.

3. The apparatus recited in claim 1 wherein:

said first one tuning mode is said "cable" tuning mode.

4. The apparatus recited in claim 3 wherein:

said predetermined group of channels includes mid-band cable channels.

5. The apparatus recited in claim 4 wherein:

said predetermined group of channels consists of cable channels 14 through 22.

* * * * *